(12) United States Patent
Raring

(10) Patent No.: US 11,201,452 B1
(45) Date of Patent: *Dec. 14, 2021

(54) SYSTEMS FOR PHOTONIC INTEGRATION IN NON-POLAR AND SEMI-POLAR ORIENTED WAVE-GUIDED OPTICAL DEVICES

(71) Applicant: KYOCERA SLD Laser, Inc., Goleta, CA (US)

(72) Inventor: James W. Raring, Santa Barbara, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,859

(22) Filed: Apr. 20, 2020

Related U.S. Application Data

(63) Continuation of application No. 16/144,811, filed on Sep. 27, 2018, now Pat. No. 10,630,050, which is a
(Continued)

(51) Int. Cl.
*H01S 5/00* (2006.01)
*H01S 5/026* (2006.01)
(Continued)

(52) U.S. Cl.
CPC ............ *H01S 5/0268* (2013.01); *G02B 6/126* (2013.01); *H01S 3/081* (2013.01); *H01S 5/005* (2013.01);
(Continued)

(58) Field of Classification Search
CPC .......... H01S 5/0268; H01S 3/081; H01S 5/22; H01S 5/32341
See application file for complete search history.

(56) References Cited

U.S. PATENT DOCUMENTS

| 4,318,058 A | 3/1982 | Mito et al. |
| 4,341,592 A | 7/1982 | Shortes et al. |

(Continued)

FOREIGN PATENT DOCUMENTS

| CN | 1538534 | 10/2004 |
| CN | 1702836 | 11/2005 |

(Continued)

OTHER PUBLICATIONS

U.S. Appl. No. 12/502,058, Final Office Action dated Aug. 19, 2011, 13 pages.
(Continued)

*Primary Examiner* — Ellen E Kim
(74) *Attorney, Agent, or Firm* — Kilpatrick Townsend & Stockton LLP

(57) ABSTRACT

A monolithically integrated optical device. The device has a gallium and nitrogen containing substrate member having a surface region configured on either a non-polar or semi-polar orientation. The device also has a first waveguide structure configured in a first direction overlying a first portion of the surface region. The device also has a second waveguide structure integrally configured with the first waveguide structure. The first direction is substantially perpendicular to the second direction.

19 Claims, 10 Drawing Sheets

Related U.S. Application Data continuation of application No. 15/639,835, filed on Jun. 30, 2017, now Pat. No. 10,090,638, which is a continuation of application No. 14/978,485, filed on Dec. 22, 2015, now Pat. No. 9,711,941, which is a continuation of application No. 14/330,956, filed on Jul. 14, 2014, now Pat. No. 9,239,427, which is a continuation of application No. 13/752,178, filed on Jan. 28, 2013, now Pat. No. 8,805,134.

(60) Provisional application No. 61/600,536, filed on Feb. 17, 2012.

(51) Int. Cl.

| | |
|---|---|
| *H01S 5/0625* | (2006.01) |
| *H01S 5/343* | (2006.01) |
| *H01S 5/22* | (2006.01) |
| *H01S 5/10* | (2021.01) |
| *H01S 5/32* | (2006.01) |
| *G02B 6/126* | (2006.01) |
| *H01S 3/081* | (2006.01) |
| *H01S 5/323* | (2006.01) |
| *H01S 5/125* | (2006.01) |
| *G02B 6/12* | (2006.01) |

(52) U.S. Cl.
CPC ............ *H01S 5/026* (2013.01); *H01S 5/0625* (2013.01); *H01S 5/1003* (2013.01); *H01S 5/22* (2013.01); *H01S 5/2201* (2013.01); *H01S 5/3202* (2013.01); *H01S 5/320275* (2019.08); *H01S 5/32341* (2013.01); *H01S 5/34333* (2013.01); *G02B 2006/12085* (2013.01); *G02B 2006/12121* (2013.01); *H01S 5/125* (2013.01); *H01S 5/32025* (2019.08)

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,821,555 A | 10/1998 | Saito et al. |
| 5,882,468 A | 3/1999 | Crockett et al. |
| 5,888,907 A | 3/1999 | Tomoyasu et al. |
| 5,951,923 A | 9/1999 | Horie et al. |
| 5,960,024 A | 9/1999 | Li et al. |
| 6,069,394 A | 5/2000 | Hashimoto et al. |
| 6,072,197 A | 6/2000 | Horino et al. |
| 6,072,924 A | 6/2000 | Sato et al. |
| 6,153,010 A | 11/2000 | Kiyoku et al. |
| 6,195,381 B1 | 2/2001 | Botez et al. |
| 6,379,985 B1 | 4/2002 | Cervantes et al. |
| 6,451,157 B1 | 9/2002 | Hubacek |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,119,487 B2 | 10/2006 | Ikeda |
| 7,128,849 B2 | 10/2006 | Setlur et al. |
| 7,303,630 B2 | 12/2007 | Motoki et al. |
| 7,312,156 B2 | 12/2007 | Granneman et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,330,144 B2 | 12/2012 | Strittmatter et al. |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 8,634,442 B1 | 1/2014 | Raring et al. |
| 8,741,674 B2 | 6/2014 | Yoshizumi et al. |
| 8,767,787 B1 | 7/2014 | Raring et al. |
| 8,805,134 B1 | 8/2014 | Raring |
| 9,239,427 B1 | 1/2016 | Raring |
| 9,711,941 B1 | 7/2017 | Raring |
| 10,090,638 B1 | 10/2018 | Raring |
| 10,630,050 B1 | 4/2020 | Raring |
| 2001/0048114 A1 | 12/2001 | Morita et al. |
| 2002/0003918 A1 | 1/2002 | Ooi et al. |
| 2002/0027933 A1 | 3/2002 | Tanabe et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |

(56) References Cited

U.S. PATENT DOCUMENTS

| | | |
|---|---|---|
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0033009 A1 | 2/2006 | Kobayashi et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0086319 A1 | 4/2006 | Kasai et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0193359 A1 | 8/2006 | Kuramoto |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | Leboeuf et al. |
| 2007/0093073 A1 | 4/2007 | Farrell, Jr. et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0092812 A1 | 4/2008 | Mcdiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0321778 A1 | 12/2009 | Chen et al. |
| 2010/0001300 A1 | 1/2010 | Raring et al. |
| 2010/0006546 A1 | 1/2010 | Young et al. |
| 2010/0006873 A1 | 1/2010 | Raring et al. |
| 2010/0044718 A1 | 2/2010 | Hanser et al. |
| 2010/0080001 A1 | 4/2010 | Kunoh et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0195687 A1 | 8/2010 | Okamoto et al. |
| 2010/0220262 A1 | 9/2010 | Demille et al. |
| 2010/0276663 A1 | 11/2010 | Enya et al. |
| 2010/0290498 A1 | 11/2010 | Hata et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0026379 A1* | 2/2011 | Shimazawa ............ G11B 5/314 369/13.33 |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0261849 A1 | 10/2011 | Shinagawa et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0251048 A1 | 10/2012 | Ouyang et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2016/0315450 A1 | 10/2016 | Raring et al. |

FOREIGN PATENT DOCUMENTS

| | | |
|---|---|---|
| CN | 1781195 | 5/2006 |
| CN | 101009347 | 8/2007 |
| CN | 101079463 | 11/2007 |
| CN | 101099245 | 1/2008 |
| CN | 101171692 | 4/2008 |
| JP | 03-287770 | 12/1991 |
| JP | 2007-173467 | 7/2007 |
| JP | 2008-130591 | 6/2008 |
| JP | 2008-288527 | 11/2008 |
| JP | 2010-109332 | 5/2010 |
| JP | 2011-077326 | 4/2011 |
| WO | 2004/084275 | 9/2004 |
| WO | 2008/041521 | 4/2008 |
| WO | 2009/124317 | 10/2009 |

OTHER PUBLICATIONS

U.S. Appl. No. 12/502,058, Non-Final Office Action dated Dec. 8, 2010, 15 pages.

U.S. Appl. No. 12/502,058, Notice of Allowance dated Apr. 16, 2012, 10 pages.

U.S. Appl. No. 15/639,835, Non-Final Office Action dated Jan. 12, 2018, 7 pages.

U.S. Appl. No. 15/639,835, Notice of Allowance dated May 18, 2018, 5 pages.

(56) References Cited

OTHER PUBLICATIONS

U.S. Appl. No. 13/114,806, Final Office Action dated Mar. 10, 2016, 14 pages.
U.S. Appl. No. 13/114,806, Final Office Action dated Aug. 26, 2013, 22 pages.
U.S. Appl. No. 13/114,806, Final Office Action dated Aug. 27, 2014, 22 pages.
U.S. Appl. No. 13/114,806, Non-Final Office Action dated Oct. 5, 2015, 15 pages.
U.S. Appl. No. 13/114,806, Non-Final Office Action dated Jan. 14, 2015, 21 pages.
U.S. Appl. No. 13/114,806, Non-Final Office Action dated Apr. 12, 2013, 22 pages.
U.S. Appl. No. 13/114,806, Non-Final Office Action dated Feb. 13, 2014, 23 pages.
U.S. Appl. No. 13/546,943, Final Office Action dated Feb. 28, 2014, 17 pages.
U.S. Appl. No. 13/546,943, Non-Final Office Action dated Nov. 20, 2013, 16 pages.
U.S. Appl. No. 13/546,943, Notice of Allowance dated Apr. 21, 2014, 8 pages.
U.S. Appl. No. 13/752,178, Notice of Allowance dated Apr. 2, 2014, 9 pages.
U.S. Appl. No. 14/330,956, Non-Final Office Action dated May 19, 2015, 8 pages.
U.S. Appl. No. 14/330,956, Notice of Allowance dated Sep. 15, 2015, 5 pages.
U.S. Appl. No. 14/978,485, First Action Interview Pilot Program Pre-Interview Communication dated Dec. 8, 2016, 4 pages.
U.S. Appl. No. 14/978,485, Notice of Allowance dated Mar. 22, 2017, 6 pages.
U.S. Appl. No. 15/095,825, Advisory Action dated Aug. 31, 2017, 3 pages.
U.S. Appl. No. 15/095,825, Final Office Action dated Jun. 15, 2017, 21 pages.
U.S. Appl. No. 15/095,825, Non-Final Office Action dated Nov. 4, 2016, 21 pages.
U.S. Appl. No. 16/144,811 Non-Final Office Action dated May 2, 2019, 10 pages.
U.S. Appl. No. 16/144,811 Final Office Action dated Sep. 4, 2019, 7 pages.
U.S. Appl. No. 16/144,811 Notice of Allowance dated Dec. 13, 2019, 7 pages.
Abare et al., Cleaved and Etched Facet Nitride Laser Diodes, IEEE Journal of Selected Topics in Quantum Electronics, vol. 4, Issue 3, May-Jun. 1998, pp. 505-509.
Adesida et al., Characteristics of Chemically Assisted Ion Beam Etching of Gallium Nitride, Applied Physics Letters, vol. 65, Issue 7, Aug. 15, 1994, pp. 889-891.
Feezell et al., Development of Nonpolar and Semipolar InGaN/GaN Visible Light-Emitting Diodes, MRS Bulletin, vol. 34, Issue 5, May 2009, pp. 318-323.
Founta et al., Anisotropic Morphology of Nonpolar a-Plane GaN Quantum Dots and Quantum Wells, Journal of Applied Physics, vol. 102, Issue 7, Oct. 2, 2007, pp. 074304-1-074304-6.
Franssila, Tools for CVD and Epitaxy, Introduction to Microfabrication, 2004, pp. 329-336.
Joyner et al., Extremely Large Band Gap Shifts for MOW Structures by Selective Epitaxy on $SiO_2$ Masked Substrates, IEEE Photonics Technology Letters, vol. 4, Issue 9, Sep. 1992, pp. 1006-1009.
Khan et al., Cleaved Cavity Optically Pumped InGaN—GaN Laser Grown on Spinel Substrates, Applied Physics Letters, vol. 69, Issue 16, Oct. 14, 1996, pp. 2418-2420.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, Oct. 2004, pp. 7032-7035.
Okamoto et al., Continuous-Wave Operation of m-Plane InGaN Multiple Quantum Well Laser Diodes, The Japan Society of Applied Physics, JJAP Express Letter, vol. 46, No. 9, Feb. 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, No. 7, Jun. 20, 2008, pp. 072201-1-072201-3.
Park, Crystal Orientation Effects On Electronic Properties of Wurtzite InGaN/GaN Quantum Wells, Journal of Applied Physics, vol. 91, Issue 12, Jun. 15, 2002, pp. 9904-9908.
PCT/US2010/030939, International Search Report and Written Opinion dated Jun. 16, 2010, 9 pages.
PCT/US2011/037792, International Preliminary Report on Patentability dated Dec. 6, 2012, 8 pages.
PCT/US2011/060030, International Search Report and Written Opinion dated Mar. 21, 2012, 8 pages.
Romanov et al., Strain-Induced Polarization in Wurtzite III-Nitride Semipolar Layers, Journal of Applied Physics, vol. 100, Issue 2, 023522, May 2006, pp. 023522-1-023522-10.
Schoedl et al., Facet Degradation of GaN Heterostructure Laser Diodes, Journal of Applied Physics, vol. 97, Issue 12, 123102, 2005, pp. 1-8.
Schremer et al., Progress in Etched Facet Technology for GaN and Blue Lasers, Proc. of SPIE, vol. 6473, 2007, pp. 64731F-1-64731F-8.
Tyagi et al., Semipolar (1011) InGaN/GaN Laser Diodes on Bulk GaN Substrates, Japanese Journal of Applied Physics, vol. 46, No. 19, May 11, 2007, pp. L444-L445.
Zhong et al., Demonstration of High Power Blue-Green Light Emitting Diode on Semipolar (1122) Bulk GaN Substrate, Electronics Letters, vol. 43, Issue 15, Jul. 19, 2007, 2 pages.

\* cited by examiner

SYSTEMS FOR PHOTONIC INTEGRATION IN NON-POLAR AND SEMI-POLAR ORIENTED WAVE-GUIDED OPTICAL DEVICES

CROSS-REFERENCES TO RELATED APPLICATIONS

This application is a continuation of U.S. patent application Ser. No. 16/144,811, filed Sep. 27, 2018, which is a continuation of U.S. patent application Ser. No. 15/639,835, filed Jun. 30, 2017, which is a continuation of U.S. patent application Ser. No. 14/978,485, filed Dec. 22, 2015, which is a continuation of U.S. patent application Ser. No. 14/330,956, filed Jul. 14, 2014, which is a continuation of U.S. patent application Ser. No. 13/752,178, filed Jan. 28, 2013, which claims priority to U.S. Provisional Patent Application No. 61/600,536, filed Feb. 17, 2012, each of which is hereby incorporated by reference herein for all purposes. This application is related to U.S. patent application Ser. No. 12/502,058, filed Jul. 13, 2009, which claims priority to U.S. Provisional Patent Application No. 61/080,655, filed on Jul. 14, 2008, both of which are hereby incorporated by reference herein for all purposes.

BACKGROUND OF THE INVENTION

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it is seen that techniques for improving optical devices are highly desired.

SUMMARY OF THE INVENTION

According to various embodiments of the present invention, techniques generally related to lighting are provided. More specifically, embodiments of the present invention provide methods and devices using multi-directional laser cavities configured on semipolar and/or non-polar oriented surfaces.

In a specific embodiment, the present invention provides a monolithically integrated optical device. The device includes a gallium and nitrogen containing substrate member having a surface region, which is configured on either a non-polar or semi-polar orientation. The device also has a first waveguide structure configured in a first direction overlying a first portion of the surface region. The first waveguide structure is configured in the first direction being characterized by a first gain and loss. The device has a second waveguide structure configured with the first waveguide structure. The second waveguide structure is configured in a second direction overlying a second portion of the surface region. The second waveguide structure is configured in the second direction being characterized by a second gain and loss. In this example, the first direction is substantially perpendicular to the second direction. Each of the waveguide structures may also comprises multiple sections, each of which is similar or different.

In an alternative specific embodiment, the present invention provides a monolithically integrated optical device. The device includes a gallium and nitrogen containing substrate member having a surface region, which is configured on either a non-polar or semi-polar orientation. The device also has a first waveguide structure configured in a first direction overlying a first portion of the surface region. The first waveguide structure is configured in the first direction being characterized by a first gain and loss. The device has a second waveguide structure configured with the first waveguide structure using one or more mirror devices, e.g., TIR. The second waveguide structure is configured in a second direction overlying a second portion of the surface region.

The second waveguide structure is configured in the second direction being characterized by a second gain and loss. In this example, the first direction is substantially perpendicular to the second direction. Optionally, the first and second waveguide structures can be coupled to each other through mirror devices such as total internal reflector (TIR) turning mirrors or other devices such as photonic crystal turning mirrors, curved waveguides, or other waveguide structures functioning to modify the direction of light propagation. Each of the waveguide structures may also comprises multiple sections, each of which is similar or different.

By exploiting the anisotropic gain/loss inherent to nonpolar/semipolar waveguide optical devices with multiple directional waveguides within continuous cavity, we have invented a method to provide photonic integration in Ga-containing devices such as edge-emitting laser diodes operating in the blue and green regime. According to an embodiment of the present invention, a first component or "active" waveguide section would be aligned in a first direction and a second component or "passive" section would be aligned in a substantially perpendicular direction. "Active section" or "first component" could be defined as a light emitting region, a gain providing region, or a highly absorbing region. The "second component" or "passive section" could be defined as an increased bandgap energy region for low propagation loss, a phase modulation region, a facet passivation region, a mode tuning region, despeckling region, an electroaborption modulation region, or a photodetection region. By deployment of methods to efficiently and/or abruptly modify the direction of light propagation within a continuous waveguide such as total internal reflector (TIR) turning mirrors on nonpolar and semipolar crystal orientations, sections of the waveguide can be made to have different gain and absorption properties for the guided light. This is a result of the polarized emission on nonpolar/semipolar orientations along with the gain/absorption anisotropy. Using these properties, highly polarized lasing can be achieved with gain sections along one cavity direction, while second or third cavity sections oriented in different directions can be configured to have very low band-edge absorption of the polarized light generated in the waveguide section oriented in the first direction. These sections can be utilized increased functionality and modification of the emitted light. One example would be using the increased bandgap or low loss section for phase tuning and hence wavelength tuning of the laser by applying a forward or reverse bias to tune the index. Further, if a modulation signal is applied to this phase tuning section, longitudinal cavity mode hopping can be achieved to broaden the average spectral width of the laser output and reduce speckle. In a different embodiment the higher band gap passive regions would be utilized within a laser diode cavity to couple multiple gain regions positioned substantially parallel to each other to reduce the required chip length to achieve a certain cavity length and/or position two output facets on the same side of the chip. By reducing the chip length, cost reduction can be achieved due to less substrate area required for the laser diode. In another embodiment the two output facets are positioned next to each other on the same side of the chip to double the single-side output power of the chip and eliminate the need for a highly reflective coating. In other embodiments the low absorption regions could be used at the output facet for increased catastrophic optical damage (COD) threshold of the mirrors. In another embodiment, the first section and second section could be configured to provide sufficient gain to achieve lasing in two polarizations with two peak wavelengths from the two valence band edge transitions to realize a dual wavelength laser. In yet other embodiments, if at least one cavity mirror is defined at the wafer level using lithography and etching techniques, the high bandgap region can be used for definition of external electro-absorption modulators, phase modulators, or photodetectors for the fabrication of complex photonic integrated circuits.

The polarization and anisotropic gain characteristics of nonpolar/semipolar oriented gallium and nitrogen containing crystals enables a method (and resulting device) of photonic integration or active/passive integration not capable in the conventional c-plane orientation of GaN or Group III-V semiconductors GaAs or InP. These semiconductors typically require costly or complex techniques to spatially modify the bandgap energy of the light emitting regions such as quantum wells. Such techniques include selective area growth to modify the quantum well thickness and composition using a pre-masked region during growth, butt-joint regrowth where additional MOCVD re-growths are used deposit a second set of light emitting layers such as quantum wells, or quantum well disordering/intermixing methods to modify the quantum well bandgap after the initial MOCVD growth. All of these techniques to achieve multiple band gaps on the same chip for photonic integration or active/passive integration are substantially more costly than the technique described herein. That is, such techniques use waveguides with substantially perpendicular directions and exploit the anisotropic and polarization properties of nonpolar/semipolar to realize multiple band gaps on the same chip. Of course, there can be variations.

In a specific embodiment, the present method and device provides wave-guided light generated in the first section (or structure) will have a perpendicular polarization to the light generated in the second section (or structure). Again, there can be variations.

In a specific embodiment, the present invention provides a monolithically integrated optical device. The device includes a gallium and nitrogen containing substrate member having a surface region, which is configured on either a non-polar or semi-polar orientation. The device includes a first waveguide structure configured in a first direction overlying a first portion of the surface region. The first waveguide structure is configured in the first direction being characterized by a first gain and loss. The device includes a second waveguide structure configured with the first waveguide structure. The second waveguide structure is configured in a second direction overlying a second portion of the surface region. The second waveguide structure is configured in the second direction being characterized by a second gain and loss. The first direction is substantially perpendicular to the second direction.

In an alternative specific embodiment, the present invention provides a monolithically integrated optical device. The device has a gallium and nitrogen containing substrate member having a surface region, which is configured on either a non-polar or semi-polar orientation. The device also includes a first waveguide structure configured in a first direction overlying a first portion of the surface region. The first waveguide structure is configured in the first direction being characterized by a first gain and loss. The device also has a second waveguide structure configured with the first waveguide structure. The second waveguide structure is configured in a second direction overlying a second portion of the surface region. The second waveguide structure is configured in the second direction being characterized by a second gain and loss. The device has a mirror structure optically coupling the first waveguide structure with the second waveguide structure. The first direction is substantially perpendicular to the second direction.

In a specific embodiment, the present invention provides a monolithically integrated optical device. The device has a gallium and nitrogen containing substrate member having a surface region, which is configured on either a non-polar or semi-polar orientation. The device has a first waveguide structure configured in a first direction overlying a first portion of the surface region. The first waveguide structure is configured in the first direction being characterized by a first gain and loss. The device has a reflector structure optically coupling the first waveguide structure. The first waveguide structure comprises a plurality of first waveguide sections configured using the reflector structure to form a continuous waveguide cavity region.

In an alternative specific embodiment, the device includes a monolithically integrated optical device. The device also has a gallium and nitrogen containing substrate member having a surface region, which is configured on either a non-polar or semi-polar orientation. The device has a first waveguide structure configured in a first direction overlying a first portion of the surface region. The first waveguide structure is configured in the first direction being characterized by a first gain and loss. The device has a second waveguide structure configured with the first waveguide structure, the second waveguide structure being configured in a second direction overlying a second portion of the surface region. The second waveguide structure is configured in the second direction being characterized by a second gain and loss. The device has a reflector structure optically coupling the first waveguide structure with the second waveguide structure. The first direction is substantially perpendicular to the second direction. The first waveguide structure comprises a plurality of first waveguide sections; and the second waveguide structure comprises a plurality of waveguide sections and are configured using the reflector structure to form a continuous waveguide cavity region.

Embodiments of the present invention enable a cost-effective optical device for laser applications. In a specific embodiment, the optical device can be manufactured in a cost effective manner. The present laser device uses a semipolar gallium nitride material capable of achieve a green laser device, among others. In other embodiments, the laser device is capable of emitting long wavelengths such as those ranging from about 480 nm to greater than about 540 nm, but can be others such as 540 nm to 660 nm. In one or more alternative embodiments, the laser device is capable of emitting blue wavelengths such as those ranging from about 420 nm to greater than about 480 nm, but can be others. Depending upon the embodiment, one or more of the benefits may be achieved.

Although the above has been described in terms of specific examples, the present method and device can also include variations, alternatives, and modifications.

BRIEF DESCRIPTION OF THE DRAWINGS

The accompanying drawings illustrate one or more embodiments and together with the written description, serve to explain various principles of the invention. Wherever possible, the same reference numbers are used throughout the drawings to refer to the same or like elements of an embodiment, and wherein.

DETAILED DESCRIPTION OF SPECIFIC EMBODIMENTS

Figure 1:
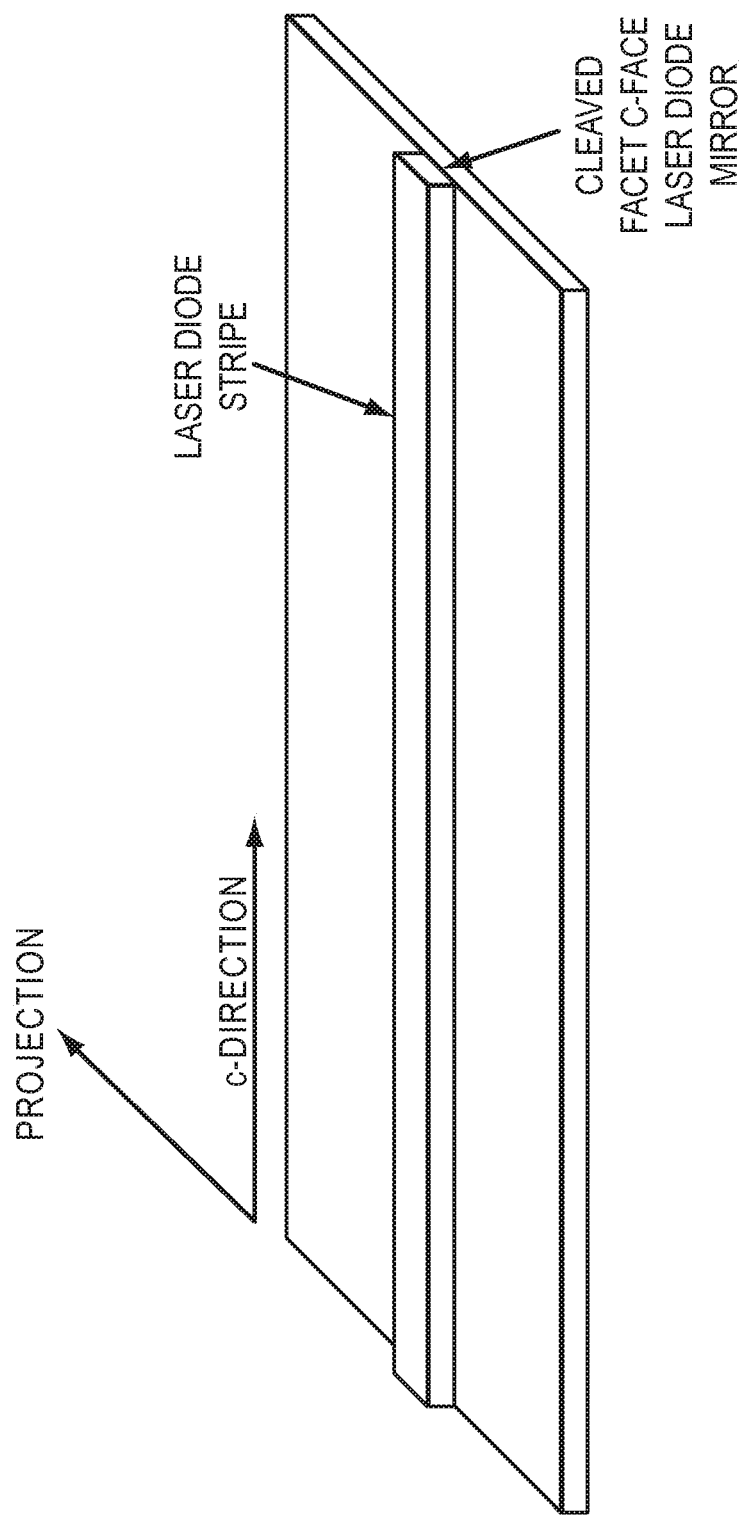
FIG. 1 is a simplified schematic diagram of a nonpolar laser diode with gain-stripe oriented along the c-direction and cleaved facets along c-face.

Various embodiments will now be described more fully hereinafter with reference to the accompanying drawings, in which exemplary embodiments are shown. Various aspects may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

According to various embodiments of the present invention, techniques generally related to lighting are provided. More specifically, embodiments of the present invention provide methods and devices using multi-directional laser cavities configured on semi-polar and/or non-polar oriented surfaces.

Conventional GaN-based laser diodes are grown on the c-plane of the wurtzite crystal, leading to spontaneous piezoelectric polarization within the heterostructure. These polarization effects generate electric fields that distort the InGaN quantum wells (QWs) into a triangular shape and spatially separate the electron and hole wavefunctions, thus reducing their radiative recombination efficiency. For electrically injected laser diodes, extra carriers screen these electric fields and flatten the distorted energy bands before efficient gain is provided. This process translates into increased threshold current densities for the lasers. Accordingly, QWs grown on c-plane crystals are typically thin (less than 4 nm) in order to alleviate these polarization-related problems (which become enhanced for greater QW thicknesses). This places several restrictions on the optical design of c-plane GaN-based lasers. One example is the inclusion of thick aluminum (Al)-containing waveguide cladding layers, such as AlGaN/GaN superlattices, for providing transverse optical-mode confinement. Unfortunately, the inclusion of thick Al-containing layers typically leads to manufacturing problems such as cracking due to tensile strain, higher-voltage operation, reduced yield, and poor reactor stability.

Figure 11:
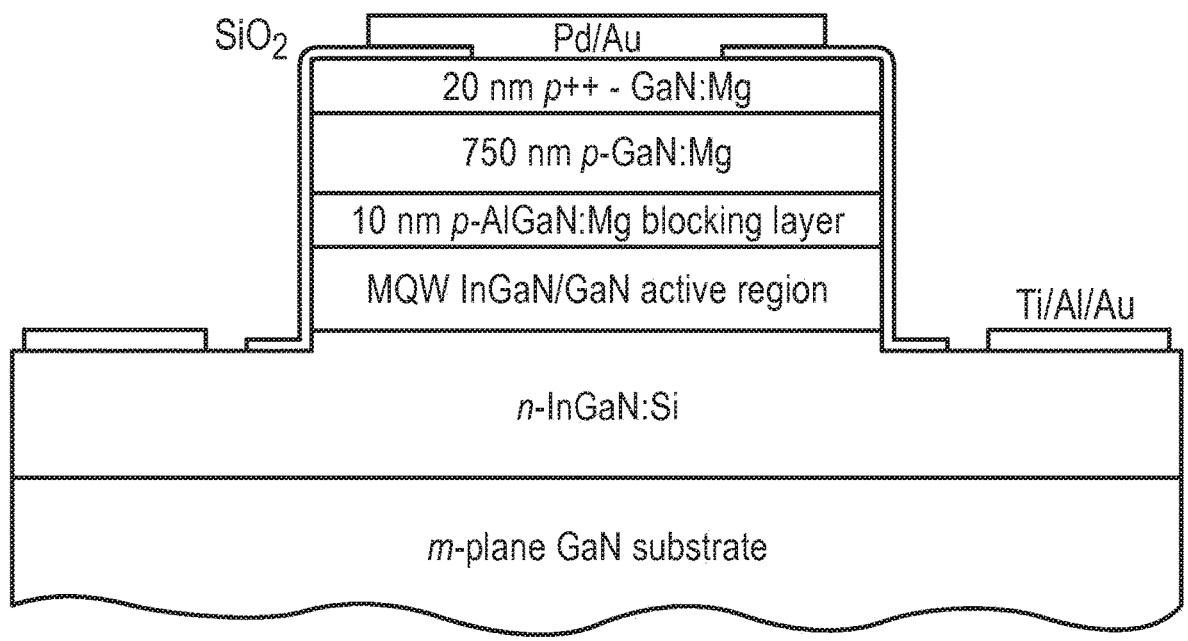
FIG. 11 is a simplified diagram illustrating an example of a laser cavity according to an embodiment of the invention.

According to embodiments of the invention, devices are developed using structures grown on nonpolar or semi-polar planes of GaN. In contrast to c-plane laser diodes, nonpolar laser diodes are grown on the side face of the wurtzite crystal; such as the m-plane or the a-plane. FIG. 11 shows a simplified schematic diagram of such a device according to an embodiment. These devices are free from the polarization-related electric fields that plague c-plane structures. The energy bands of InGaN QWs grown on m-plane GaN are undistorted, resembling the more rectangular shape of conventional QWs grown on gallium arsenide or indium phosphide. These QWs do not suffer from the separation of the electron and hole wavefunctions typical of c-plane structures. Additionally, with no polarization-related electric fields present, no extra carriers are needed to achieve efficient optical gain. The device shown in FIG. 11 includes a m-plane GaN substrate, a n-GaN:Si layer overlying the substrate, a laser guide region including a InGaN/GaN MQW active region, a 10 nm thick p-AlGaN:Mg blocking layer, a 750 nm thick p-GaN:Mg layer, a 20 nm p++ GaN:Mg layer, a Pd/Au electrode overlying the GaN:Mg layer, Ti/Al/Au electrodes overlying the n-GaN:Si layer, and a $SiO_2$ passivation layer around the laser guide region.

Relative to the conventional GaAs or InP crystals or even the polar c-plane orientation of the GaN crystal, nonpolar and semipolar crystal orientations of GaN-based active gain medium offer the unique property of anisotropic band structure due to the different c and a lattice spacing along with the emission of polarized light. This anisotropy and polarization results in differing gain and hence different absorption properties for waveguide stripes oriented in different directions along the surface of such nonpolar or semipolar crystal planes. For fabrication of nonpolar or semipolar laser diodes, conventional practice aligns the cavity direction substantially parallel to the direction of highest gain such that the laser can achieve low threshold current density and hence high efficiency. Further, most GaN based lasers in the known art use a substantially straight cavity oriented in only one direction.

An example of orienting the laser in the most favorable direction for gain would be the violet or blue nonpolar m-plane laser diodes as known in the art that show lower threshold current density when the laser stripe is oriented in the c-direction relative to those aligned in the a-direction. This directionally dependent behavior results from the combination of the band structure giving rise to material gain along with the so-called right hand rule of electromagnetics where emitted light will propagate in a direction orthogonal to the polarization. For the band structure of the GaN-based laser gain medium, there are two most likely charge carrier transitions from the conduction band to valence band, where the first is the conduction band to A1 valence band and the second is the transition from the conduction band to the B1 valence band. These two valence bands can be separated in energy or so-called degenerate at different locations in momentum space according to the dispersion diagram. The curvature of these bands will dictate the density of states and effective hole mass, which in-turn dictates the gain and absorption properties. The energy separation and curvature of the valence bands will depend on the crystal orientation, the light generating layer composition, and the strain state of the light generating layer. In nonpolar, since the A1 band has lower effective mass and is lower in energy than the B1 band, the gain will be higher and the population of A1 states will generally occur before B1 band states when electrically injected. In short, charge carrier transitions from the conduction band to the A1 band will provide higher material gain than transitions to the B1 band.

With this understanding, the key point now is to understand that light emitted from the conduction band to the A1 valence band transition will be polarized perpendicular to the c-direction (in the a-direction), whereas light emitted from conduction band to B1 valence band transition will be polarized perpendicular to the a-direction (in the c-direction). By the so called "right hand rule" of electromagnetics light cannot be emitted in the direction it is polarized. Therefore, gain from the A1 band transition will be most effectively provided to light propagating in c-oriented cavities while gain from the B1 band transition will be most effectively provided to light propagating in a-oriented cavities. And since the A1 transition will provide higher gain, c-oriented cavities will operate more favorably with lower threshold current density as reported in literature. This example of violet (390-425 nm) and blue (425-475 nm) laser diodes on nonpolar substrates can be extended to any wavelength such as cyan, green, and yellow, and more importantly, can be extended to most all nonpolar and semipolar crystal orientations such as (20-21), (30-31), (20-2-1), (30-3-1), and (11-22). For the nonpolar example we use the c-direction and a-direction as the substantially perpendicular waveguide directions with different gain and loss properties. For semipolar substrates, the substantially perpendicular directions would be the projection of the c-direction and the a-direction or the m-direction.

According to various embodiments of the present invention, we exploit the anisotropic gain and polarization characteristics of nonpolar/semipolar oriented GaN to integrate laser diodes with regions of higher effective bandgap within the same waveguide for the realization of active/passive optical devices, or further, photonic integrated circuits. By defining a multi-directional waveguide on a nonpolar or semipolar substrate, lasing action can be induced in one polarization state from gain provided in regions where the cavity is aligned substantially in one direction. For the nonpolar m-plane, maximum gain will be along the c-direction and lasing in this direction will be polarized perpendicular to the c-direction (a-direction) since it originates from the conduction band to A1 valence band transition. When this radiation or guided mode is then turned in approximately a perpendicular direction to be aligned with an a-direction, the polarization will be forced to rotate since by the right hand rule it cannot be polarized in the same direction it is propagating. Therefore, since the polarization will be rotated, by transition selection rules, it will not be able to be reabsorbed by the conduction band to A1 transition event and could only be absorbed by either free carrier absorption or a conduction band to B1 valence band transition event. Since in most cases that strained quantum wells grown on nonpolar or semipolar substrates will possess an effective bandgap energy of the transition associated with the B1 valence band that is substantially higher than that associated with the A1 valence band, the effective bandgap of the waveguide will be higher than the energy of the guided radiation and hence absorption will be significantly lower. The net result is that the regions aligned substantially in the a-direction will be higher bandgap, and hence less absorbing, then regions in the c-direction when the device is designed to operate using light generated from the c-direction oriented stripes.

These higher bandgap, or lower loss regions can be used in many ways. For example, the higher bandgap region can be inserted within the laser cavity and electrically coupled to a power supply. Under a DC power supply with forward or reverse bias applied to this region, the refractive index can be changed and thereby change the optical length of the cavity, which will have the effect of tuning the laser peak wavelength of the excited mode in the cavity by up to several nanometers. Further, if an RF bias is electrically coupled to this region the index can be modulated at high frequency, thereby causing a modulation of the excited lasing mod peak wavelength leading to an effectively broader output spectrum, which could be helpful for reduction of speckle. In a different embodiment, the higher bandgap sections are used as passive waveguide sections to couple multiple gain regions positioned substantially in parallel to each other. By coupling the gain regions in such a manner, a laser diode can be configured to have the output facets positioned on the same side of the chip, which would effectively double the single-side output power from the chip and eliminate the need for application of a highly reflective coating. In a related embodiment, the higher bandgap regions can be used as passive waveguide regions to couple the parallel-positioned active regions and minimize the required chip area to achieve a certain cavity length. In this embodiment, the length of the gain cavity can be many times the length of the chip and therefore the chip area would be greatly reduced such that more chips could be manufactured per wafer and cost savings would be realized. In yet another embodiment, the higher bandgap regions could be defined at the output facet to reduce the amount of optical absorption at the output facet and thereby increase the threshold power level for catastrophic optical damage at the mirror. In yet other embodiments, if mirrors are defined on the wafer level using a technique such as etched facet mirrors or DBR mirrors to comprise at least one end of the laser cavity, the higher bandgap region can be placed on the other side of the mirror from the laser. With electrical coupling to the higher bandgap region, the light output from the laser can be modified for increased functionality. For example, through reverse bias the light can be encoded with data through electro-absorption modulation or can be detected to power monitor or data monitor through the photocurrent that is generated with absorption.

A key enabling capability provided by various embodiments of the present invention is the ability to abruptly change the orientation of the waveguide to a substantially perpendicular direction. There are several known techniques that can be used to accomplish this abrupt turning of the direction of the light propagation including photonic crystal turning mirrors, total internal reflector (TIR) mirrors, and other waveguide modifications. Perhaps the most straightforward technique is the integration of TIR turning mirrors, which can be defined using conventional photolithography and dry etch or wet etch techniques. In addition to design optimization, it is very important that the resulting etched mirror surface is extremely smooth and vertical. Dry etching could be performed using inductively coupled plasma (ICP), reactive ion etching (RIE), or chemical assisted ion beam etching (CAIBE), or wet etching.

For cavity end mirrors, cleaved facets or wafer level integrated mirrors could be used according to embodiments of the present invention. For both types of mirrors, reflection modification can be utilized to optimize the cavity reflectivity and hence the device performance. Reflection modification can be executed using deposition techniques such as electron beam deposition or electron cyclotron resonance deposition. Cleaved facets can be realized with a scribing and breaking process, where the scribe can be implemented using technologies such as the laser scribe or a diamond scribe. Wafer level integrated mirrors can be defined etched facet technology using conventional stepper or contact lithography or holographically or e-beam lithographically defines mirrors for DBR types of mirrors. For etching the mirrors techniques such as inductively coupled plasma (ICP), reactive ion etching (RIE), or chemical assisted ion beam etching (CAIBE) can be used. Some embodiments of this invention where the passive or higher bandgap region is placed outside the laser cavity require such wafer level integrated mirrors. Further details of the present method and system can be found throughout the present specification and more particularly below.

Figure 2:
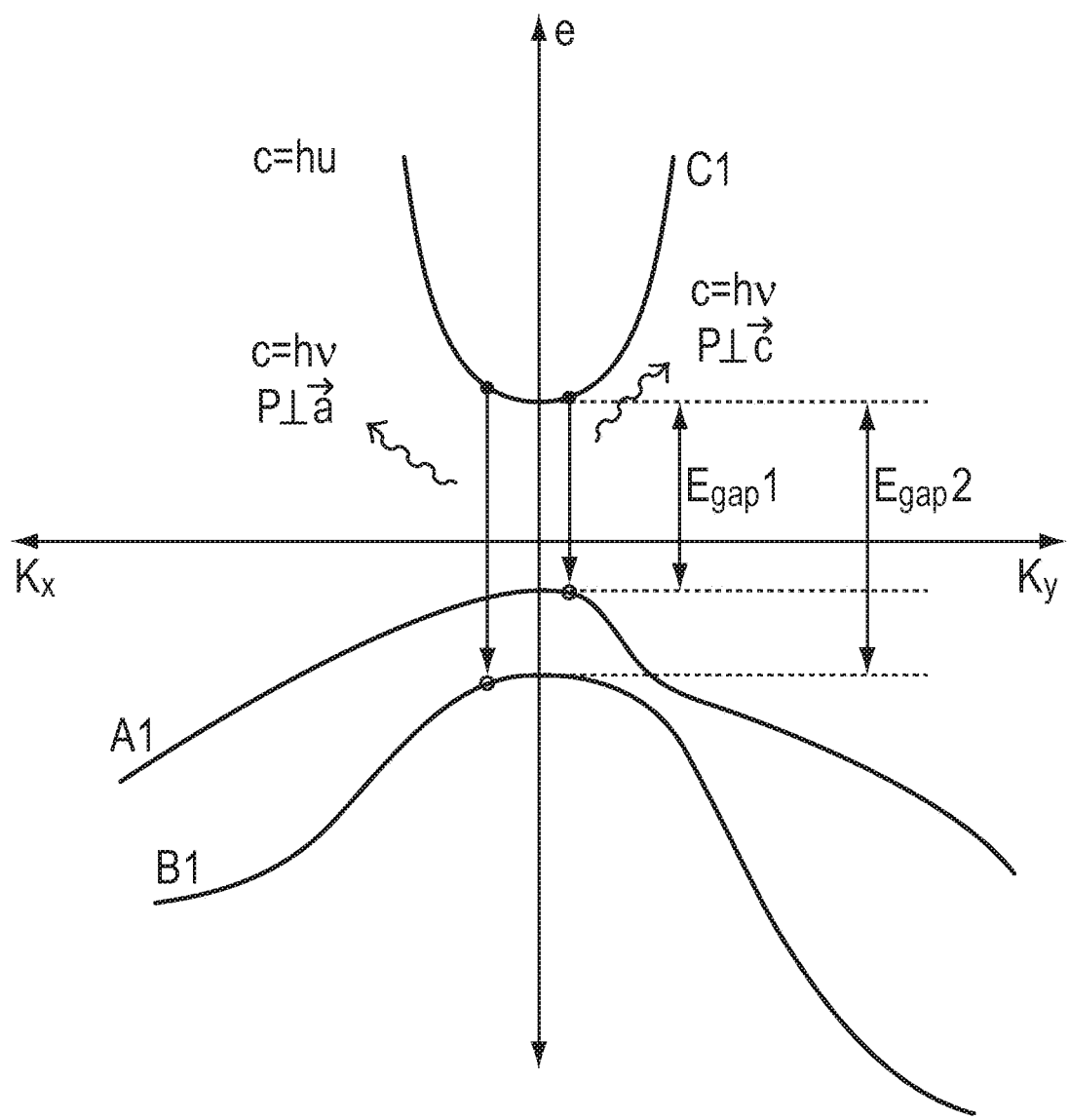
FIG. 2 is a simplified schematic dispersion diagram showing nonpolar or semipolar conduction and valence band structure to depict how light generated in a c-direction oriented waveguide will be substantially less absorbed than when the waveguide is re-directed to be aligned substantially in the a-direction.
Figure 3:
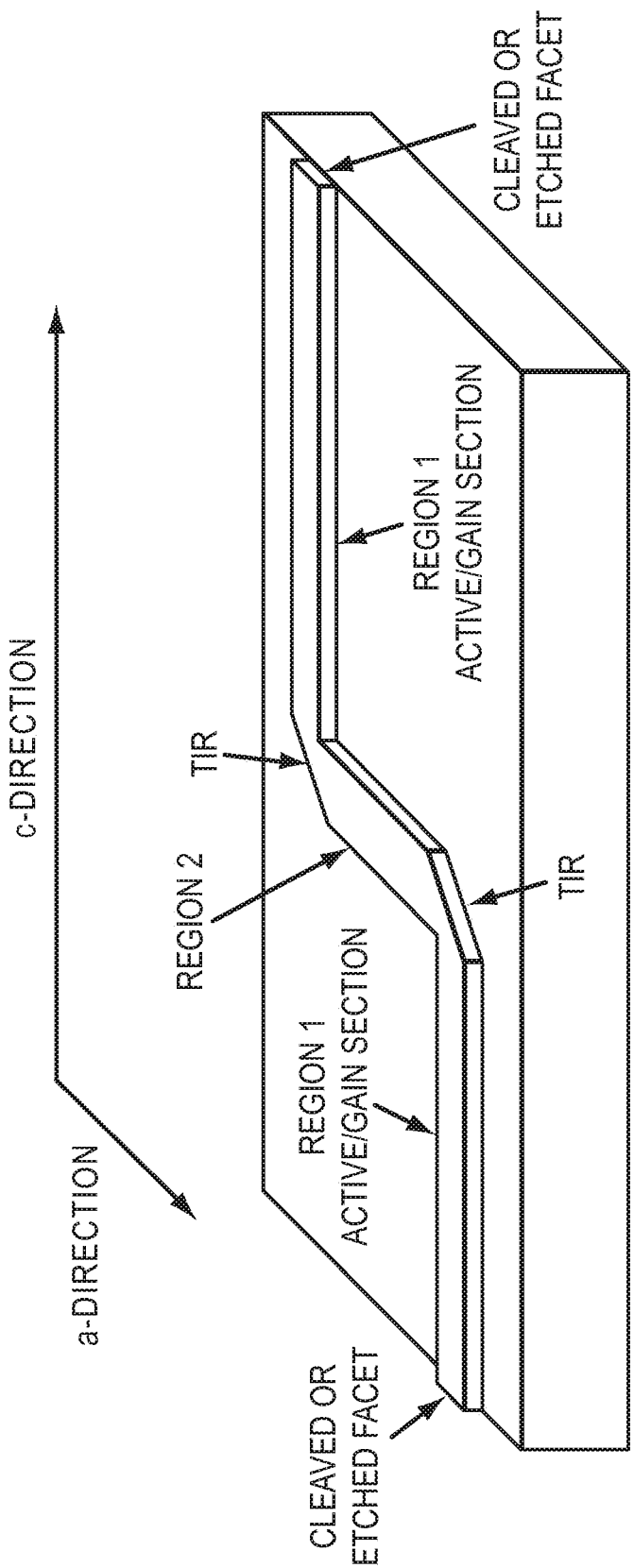
FIG. 3 is a simplified schematic diagram illustrating a nonpolar laser diode with active gain direction along c-direction and higher bandgap region along the a-direction integrated into the cavity using TIR mirrors, according to an embodiment of the present invention.
Figure 4:
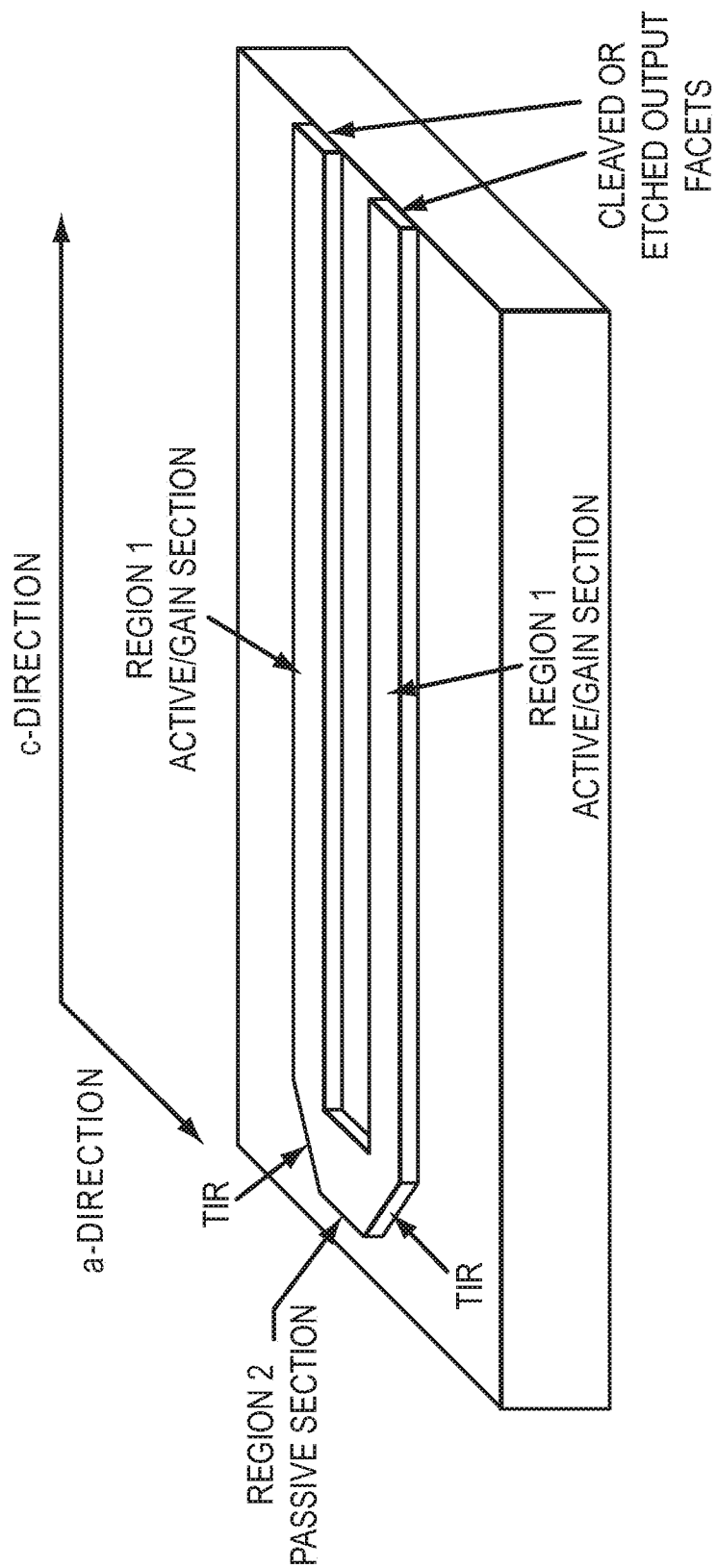
FIG. 4 is a simplified schematic diagram illustrating a nonpolar laser diode with active gain direction along c-direction and higher bandgap region along the a-direction where the higher bandgap region are used as passive optical coupling regions for parallel gain regions, according to an embodiment of the present invention.
Figure 5:
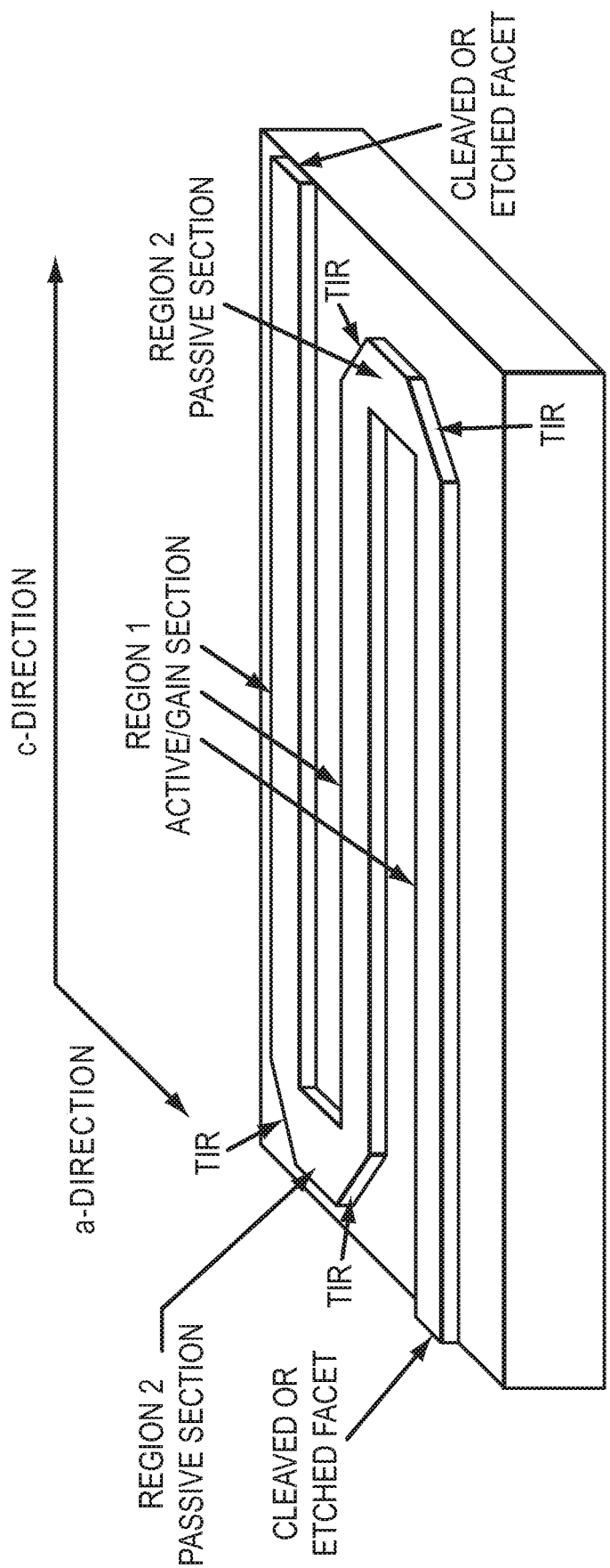
FIG. 5 is a simplified schematic diagram illustrating a nonpolar laser diode with active gain direction along c-direction and higher bandgap region along the a-direction where the higher bandgap regions are used as passive optical coupling regions for parallel gain regions, according to an embodiment of the present invention.
Figure 6:
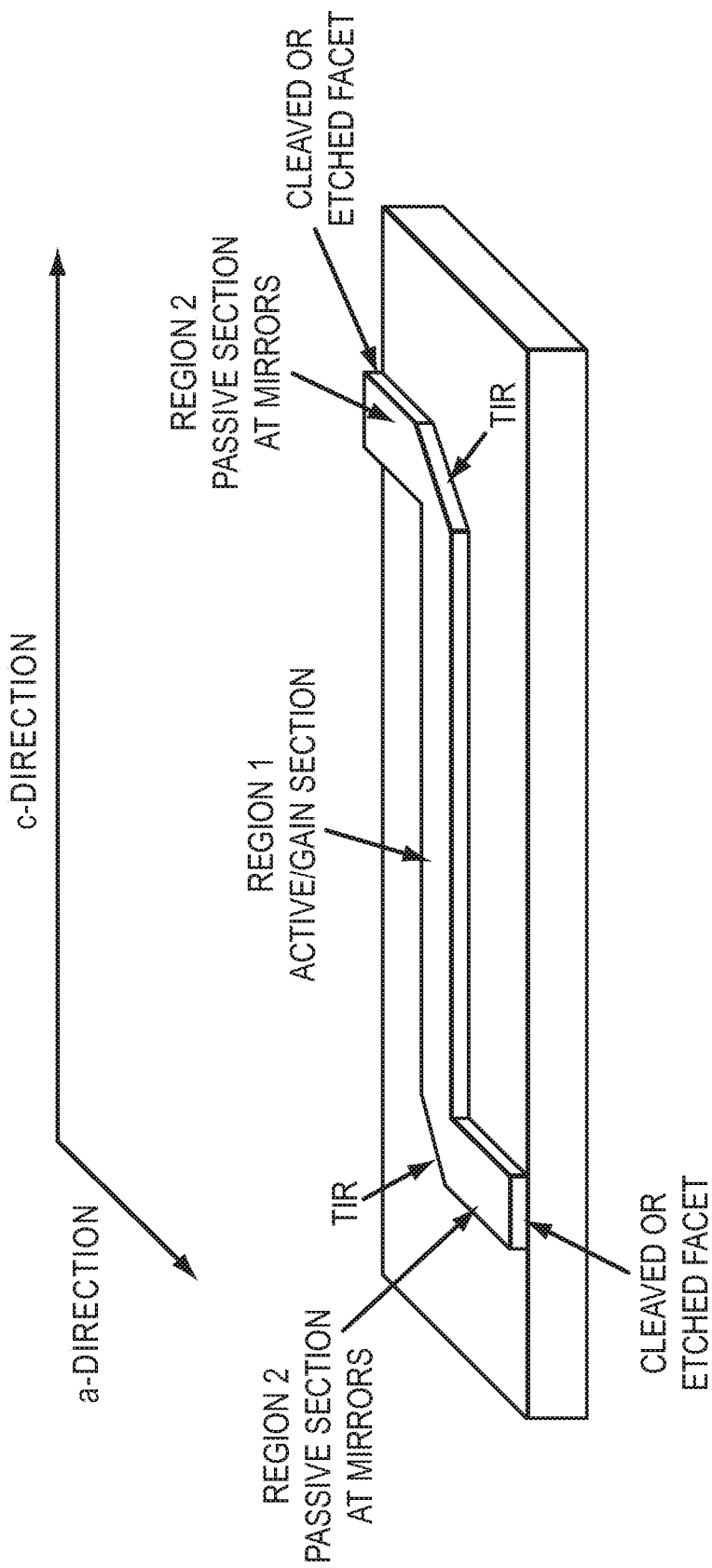
FIG. 6 is a simplified schematic diagram illustrating a nonpolar laser diode with gain direction along c-direction and higher bandgap region along the a-direction at the cleaved output facets to increase the COD threshold of the laser device, according to an embodiment of the present invention.

In one or more embodiments, the present invention can be applied to a variety of applications. These applications may include the following:

1. Cavity or wavelength tuning (for example, as shown in FIG. 2)
2. Mode hopping for increased spectral width (for example, as shown in FIG. 2)
3. Active passive integration for achieving two output facets from same side of chip (for example, as shown in FIG. 3)
4. Active passive integration for achieving increased gain length in fixed size chip for reduced chip size and hence reduced cost (for example, as shown in FIG. 4)
5. Facet passivation to increase COD threshold in high power lasers (for example, as shown in FIG. 5)
6. Photonic integrated circuits with integrated mirror on chip to realize circuits such as laser+electro-absorption modulator, laser+photo-detector, laser+phase modulator (for example, as shown in FIG. 6)
7. Dual lasing action A detailed description of each of these applications can be found more particularly below.

FIG. 1 is a simplified diagram of a nonpolar laser diode with gain-stripe oriented along the c-direction and cleaved facets along c-face according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member having a nonpolar crystalline surface region characterized by an orientation of about −2 degrees to about 2 degrees towards (0001) and less than about 0.5 degrees towards (11-20). In a specific embodiment, the gallium nitride substrate member is a bulk GaN substrate characterized by having a nonpolar crystalline surface region, but can be others. In a specific embodiment, the bulk GaN substrate has a surface dislocation density below $10^5$ cm$^{-2}$ or $10^5$ to $10^7$ cm$^{-2}$. It should be noted that homoepitaxial growth on bulk GaN is generally better than hetero-epitaxy growth. The nitride crystal or wafer may comprise Al$_x$In$_y$Ga$_{1-x-y}$N, where 0<x, y, x+y≤1. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^6$ cm$^{-2}$ or others such as those ranging from about $10^5$-$10^8$ cm$^{-2}$. Of course, there can be other variations, modifications, and alternatives.

In a specific embodiment, the device has a laser stripe region formed overlying a portion of the nonpolar crystalline orientation surface region. In a specific embodiment, the laser stripe region is characterized by a cavity orientation is substantially parallel to the c-direction. In a specific embodiment, the laser stripe region has a first end and a second end. As shown, the cavity is normal to a projection of the c-direction.

In a preferred embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. In a specific embodiment, deposition of the reflective coating occurs using, for example, electron beam (ebeam) evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed cleaved surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Of course, there can be other variations, modifications, and alternatives.

Also in a preferred embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, titania, tantalum pentoxide, zirconia, combinations, and the like. In a specific embodiment, the second mirror surface comprises an anti-reflective coating. In a specific embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed cleaved surface prior to coating. Of course, there can be other variations, modifications, and alternatives.

In a specific embodiment, the laser stripe has a length and width. The length ranges from about 50 microns to about 3000 microns. The stripe also has a width ranging from about 0.5 microns to about 50 microns, but can be other dimensions. In a specific embodiment, the stripe width can also be about 1 to 20 microns or 1 to 2 microns for a single lateral mode laser device. In a specific embodiment, the width is substantially constant in dimension, although there may be slight variations. The width and length are often formed using a masking and etching process, which are commonly used in the art. Further details of the present device can be found throughout the present specification and more particularly below.

In a specific embodiment, the device is also characterized by a spontaneously emitted light is polarized in substantially perpendicular to the c-direction. That is, the device performs as a laser or the like. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 400 nanometers to yield a violet emission, a blue emission, a green emission, and others. In other embodiments, the wavelength range is within about 405 nm or slightly more or less. In one or more embodiments, the light can be emissions ranging from violet 395 to 420 nanometers; blue 430 to 470 nm; green 500 to 540 nm; and others, which may slightly vary depending upon the application. In a preferred embodiment, the spontaneously emitted light is in the wavelength range of 430 nm and greater and is highly polarized with a polarization ratio of greater than 0.4. In a preferred embodiment, the spontaneous polarization ratio is greater than 0.3 for an emission polarized perpendicular to the c-direction for a spontaneous emission peak wavelength greater than 430 nm. In a specific embodiment, the emitted light is characterized by a polarization ratio that is desirable. Of course, there can be other variations, modifications, and alternatives. Further details of the laser device can be found throughout the present specification and more particularly below. Additionally, details of laser devices can be found in co-pending patent applications listed as PCT US/2010/030939 and publication number US 2011-0064100 A1, commonly owned, and each of which are incorporated by reference herein.

Although the above has been described in terms of a non-polar substrate orientation, the present method and gallium and nitrogen containing structures can be used in semipolar oriented gallium and nitrogen containing materials. Examples include gallium and nitrogen containing substrates configured using (30-31), (30-3-1), (20-21), (20-2-1), (10-11), (10-1-1), and (11-22) among others. The gallium and nitrogen containing substrates can include GaN, which may be offcuts to these planes by +/−4 degrees towards the c-direction and/or the a-direction, among others. Further details of the present method and device structures can be found more particularly below.

FIG. 2 is a simplified dispersion diagram showing nonpolar or semipolar conduction and valence band structure to depict how light generated in a c-direction oriented waveguide will be substantially less absorbed when the waveguide is re-directed to be aligned substantially in the a-direction. By leveraging the polarization properties, the anisotropic band structure, and energy band gap differences, regions of higher bandgap are formed on the chip, which may be used for passive waveguides or photonic integration. As shown in FIG. 2, c=hυ (P⊥a), represents transitions from the C1 to B1 band resulting in light polarized perpendicular to the a-direction, and therefore the resulting waveguided light must propagate in the a-direction; and c=hυ (P⊥c) represents transitions form the C1 to A1 band, which result in light polarized perpendicular to the c-direction, and therefore resulting in waveguided light propagating in the c-direction. Transitions from the C1 to A1 band have a lower band gap energy than the transitions from C1 to B1 because $E_{gap2} > E_{gap1}$. Transitions from the C1 to A1 band result in higher gain than transitions from C1 to B1, and therefore it is advantageous to align gain providing waveguide along the c-direction to generate light from the C1 to A1 transition. When light generated from the C1 to A1 transition is turned substantially perpendicular to propagate in the a-direction, the polarization switches to perpendicular to a-direction and it can no longer be absorbed by the C1 to A1 transition. Because this light guided in the a-direction is generated from the lower energy C1 to A1 transition, the higher bandgap energy for the C1 to B1 transition will result in less absorption. Therefore, the higher bandgap a-direction waveguide can be used for passive sections or integration.

FIG. 3 is a simplified diagram illustrating a nonpolar laser diode with active gain direction along c-direction and higher bandgap region along the a-direction integrated into the cavity using TIR mirrors. With electrical coupling the higher bandgap region can be used for tuning of the peak lasing wavelength or modulation of the lasing peak wavelength for spectral broadening to be used in applications such as despeckling applications. In the embodiment shown in FIG. 3, Region 1 is substantially aligned in the c-direction and represents the gain providing active region to induce lasing with injection of current. Region 2 is aligned substantially in the a-direction and can be used as a passive section or an intra-cavity modulator region for wavelength tuning or mod-hopping to reduce speckle with forward or reverse bias.

FIG. 4 is a simplified diagram illustrating a nonpolar laser diode with active gain direction along c-direction and higher bandgap region along the a-direction where the higher bandgap regions are used as passive optical coupling regions for parallel gain regions. The laser output facets are positioned on the same side of the chip to double the single-side output power from the laser and eliminate the need for a highly reflective coating. The active and passive sections are coupled using integrated TIR mirrors. In the embodiment shown in FIG. 4, Region 1 is substantially aligned in the c-direction and represents the gain providing active region to induce lasing with injection of current. Region 2 is aligned substantially in the a-direction and is sued as a passive section to optically couple the active sections comprising Region 1. This configuration enables both output facets from the same side of the chip to eliminate the need for HR coating while reducing the chip area for cost reduction.

FIG. 5 is a simplified diagram illustrating a nonpolar laser diode with primary gain regions oriented along the c-direction and higher bandgap regions oriented along the a-direction where the higher bandgap regions are used as passive optical coupling regions for parallel gain regions. In this embodiment there are three gain sections to yield a gain length that is nearly 3× the length of the chip to enable reduced chip area for a given required cavity length. This reduces the chip foot print and hence the cost of the chip. The active and passive sections are coupled using integrated TIR mirrors. In the embodiment shown in FIG. 5, Region 1 is substantially aligned in the c-direction and represents the gain providing active region to induce lasing with injection of current. Region 2 is aligned substantially in the a-direction and is used as passive waveguide sections to optically couple the active sections comprising Region 1. This active/passive coupling can enable greatly increased cavity lengths within a fixed length chip for cost reduction.

FIG. 6 is a simplified diagram illustrating a nonpolar laser diode with gain direction along c-direction and higher bandgap region along the a-direction at the output facets. The higher bandgap a-direction mirrors will increase the COD threshold of the mirror in the laser device. In the embodiment shown in FIG. 6, Region 1 is aligned substantially in the c-direction and functions as the gain providing active region to induce lasing and Region 2, aligned substantially in the a-direction, are passive sections at the output facts to reduce absorption and hence increase the COD threshold of the laser.

Figure 7:
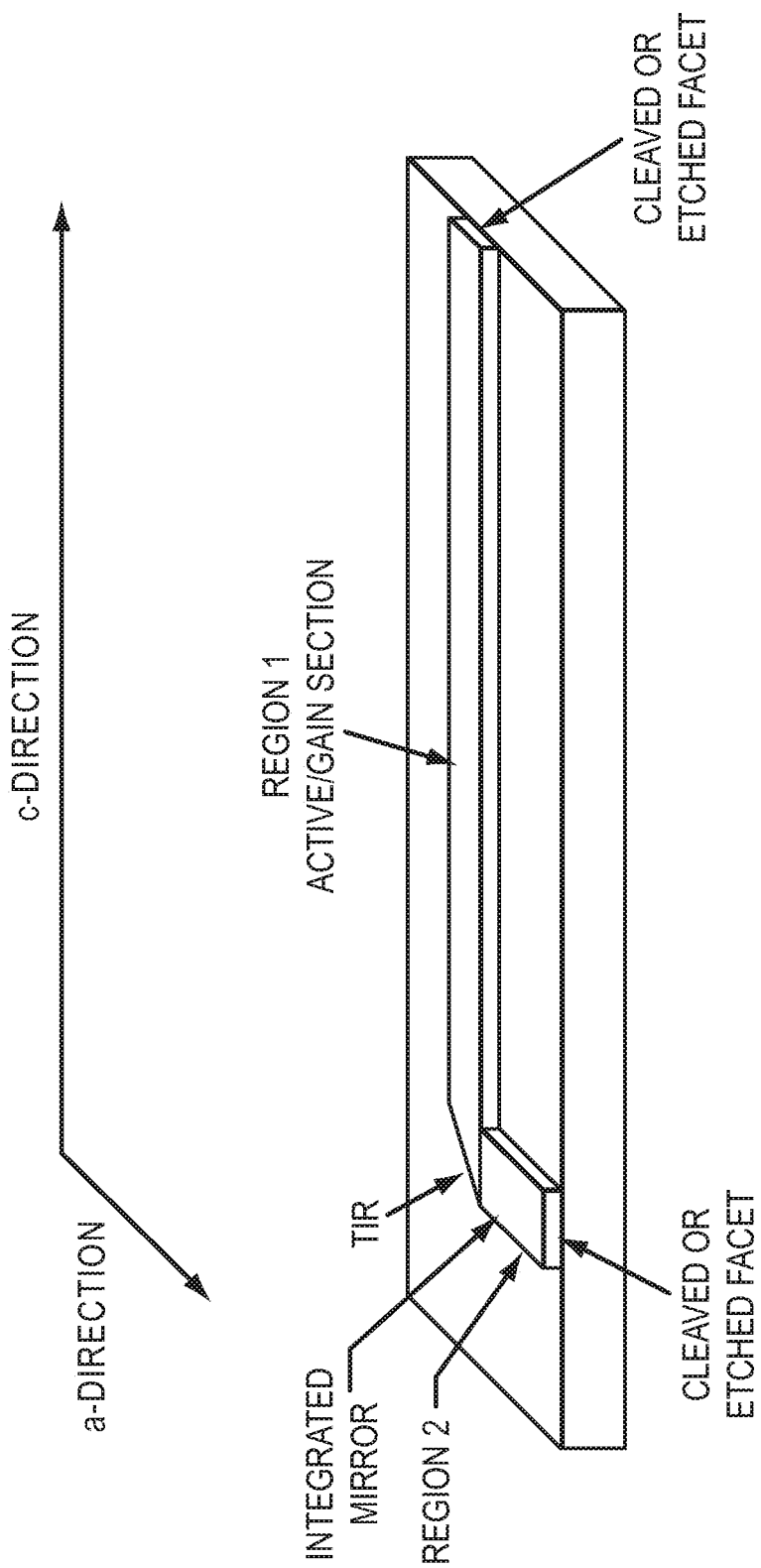
FIG. 7 is a simplified schematic diagram illustrating a nonpolar laser diode with gain direction along c-direction and higher bandgap region along the a-direction positioned after an integrated mirror comprising one end of the laser cavity, according to an embodiment of the present invention.
Figure 8C:
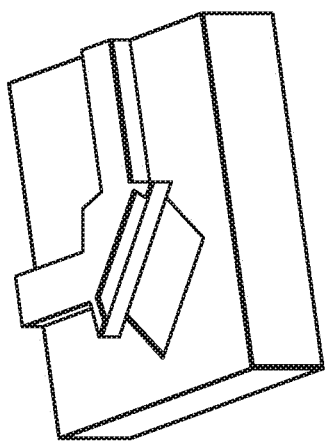
FIGS. 8A-8E show a series of simplified diagrams illustrating an example of process sequence to define total internal reflector mirrors.
Figure 8B:
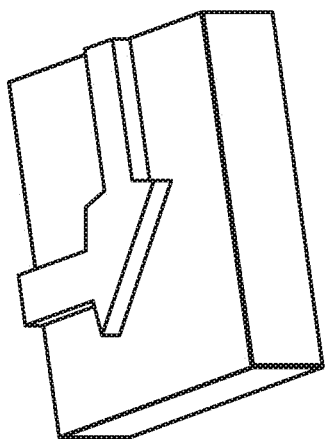
Figure 8A:
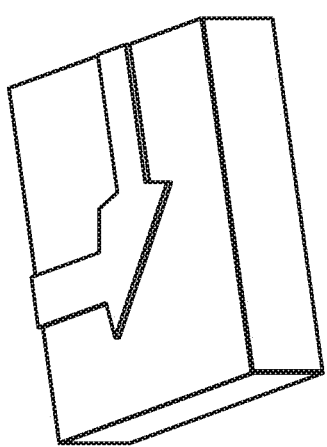
Figure 8E:
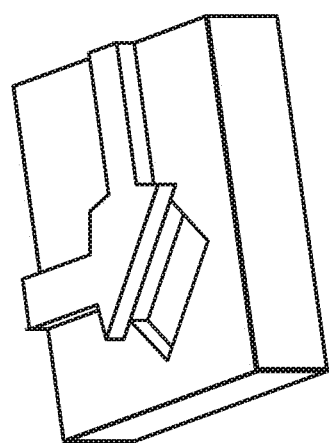
Figure 8D:
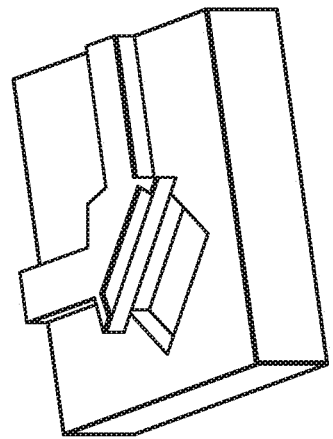

FIG. 7 is a simplified diagram illustrating a nonpolar laser diode with gain direction along c-direction and higher bandgap region along the a-direction positioned after an integrated mirror comprising one end of the laser cavity. In this embodiment the, the higher bandgap region can be electrically coupled and function as an electroabsorption modulator or photodetector if run in the reverse bias mode or act as a phase modulator. In the embodiment shown in FIG. 7, region 1 is substantially aligned in the c-direction and represents the gain providing active region to induce lasing with injection of current. The device is configured to lase for the cleaved facet mirror and the integrated mirror which could be an etched facet or a DBR. Region 2 is aligned substantially in the a-direction and position outside the cavity and can function as a passive section or with electrical coupling can function as an electro-absorption modulator, photodetector, or other.

FIGS. 8A-8E are simplified diagrams illustrating an example of process sequence to define total internal reflector mirrors taken from literature. Similar processes could be used to define total internal reflector mirrors on nonpolar or semi-polar GaN using the appropriate etch and photo-mask techniques necessary for GaN. The etch could be a dry etch or a wet etch. Dry etching could be performed using inductively coupled plasma (ICP), reactive ion etching (RIE), or chemical assisted ion beam etching (CAIBE). The embodiment shown in FIGS. 8A-8E is an example of a process sequence to define total internal reflector mirrors. Similar processes could be used to define total internal reflector mirrors on nonpolar or semipolar GaN using the appropriate etch and photomask techniques necessary for GaN. The etch could be a dry etch or a wet etch. Dry etching could be performed using inductively coupled plasma (ICO), reactive ion etching (RIE), or chemical assisted ion beam etching (CAIBE).

Figure 9:
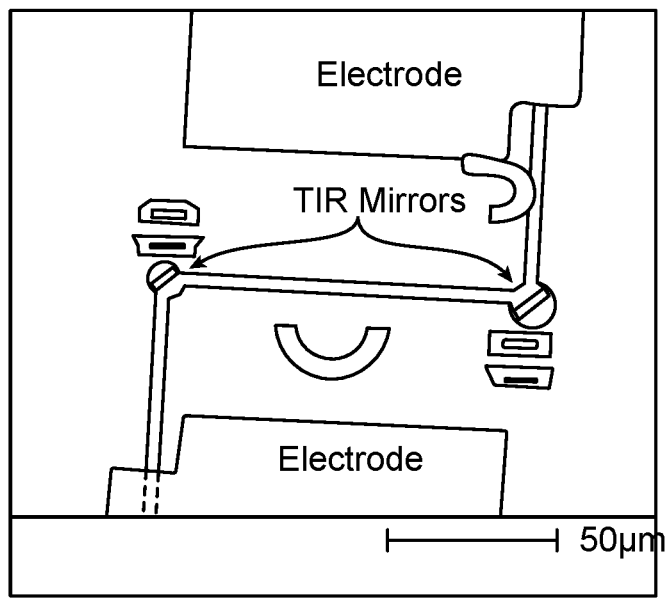
FIG. 9 is a simplified diagram illustrating an example of total internal reflector mirrors integrated into a semiconductor waveguide to turn light in substantially perpendicular direction.

FIG. 9 is a simplified diagram illustrating an example from literature of total internal reflectors mirror integrated into semiconductor waveguide to turn light in substantially perpendicular direction. According to embodiments of the invention, we integrated such reflectors in nonpolar and semipolar based waveguide devices to achieve waveguiding in the c-direction or projection of the c-direction within same waveguide as guiding in the a-direction or m-direction. FIG. 9 shows an example of total internal reflector mirrors integrated into a semiconductor waveguide to turn light in a substantially perpendicular direction. Reflectors are integrated in non-polar and semi-polar based waveguide devices to achieve waveguiding in the c-direction or projection of the c-direction within the same waveguide as guiding in the a-direction or m-direction.

Figure 10:
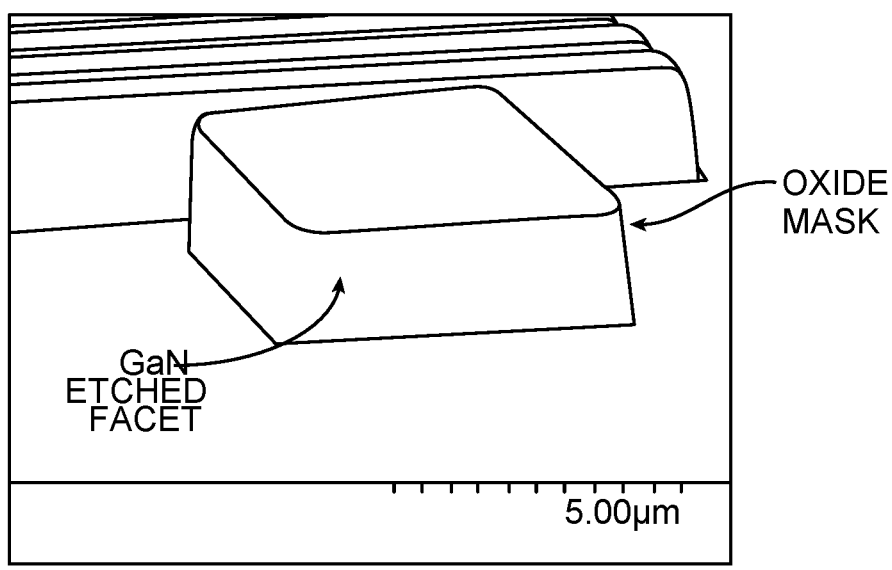
FIG. 10 is an image illustrating an example of etched facet technology for integrated laser cavity mirrors.

FIG. 10 is a simplified diagram illustrating an example from literature of etched facet technology for integrated laser cavity mirrors that can be used in addition to or in place of cleaved facet mirrors for photonic integration on nonpolar and semi-polar GaN. Further details of each of the laser device structures can be found throughout the present specification and more particularly below. FIG. 10 shows an example of etched facet technology for integrated laser cavity mirrors that can be sued in addition to or in place of cleaved facet mirrors for photonic integration on non-polar and semi-polar GaN.

In one or more preferred embodiments, the present invention provides a laser structure without an aluminum bearing cladding region. In a specific embodiment, the laser device comprises a multi-quantum well active region having thin barrier layers. In one or more embodiments, the active region comprises three or more quantum well structures. Between each of the quantum well structures comprises a thin barrier layer, e.g., 8 nm and less, 7 nm and less, 6 nm and less, 5 nm and less, 4 nm and less, 3 nm and less, 2 nm and less, 1.5 nm and less. In a preferred embodiment, the combination of thin barrier layers configured in the multi-quantum well structures enables a low voltage (e.g., 7 volts and less, 6 volts and less) laser diode free from use of aluminum bearing cladding regions.

In a specific embodiment, the present invention provides an optical device. The optical device has a gallium and nitrogen containing substrate including a {20-21}, {30-31}, {20-2-1}, or {30-3-1} crystalline surface region orientation, which may be off-cut. The device preferably has an n-type cladding material overlying the n-type gallium and nitrogen containing material according to a specific embodiment. The n-type cladding material is substantially free from an aluminum bearing material according to a specific embodiment. The device also has an active region comprising at least three quantum wells. Each of the quantum wells has a thickness of 2.5 nm and greater or 4.5 nm and greater and one or more barrier layers. Each of the barrier layers has a thickness ranging from about 2 nm to about 4 nm or about 3 nm to about 6.5 nm and is configured between a pair of quantum wells according to a specific embodiment. At least one or each of the barrier layers has a thickness ranging from about 2 nm to about 4 nm and is configured between a pair of quantum wells or adjacent to a quantum well according to a specific embodiment. At least one or each of the barrier layers has a thickness ranging from about 3 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 7V or less than about 6V or less than about 5V for the device for an output power of 60 mW or 100 mW and greater. Of course, there can be other variations, modifications, and alternatives.

In yet an alternative embodiment, the present invention provides an optical device. The device has a gallium and nitrogen containing substrate including a {20-21}, {30-31}, {20-2-1}, or {30-3-1} crystalline surface region orientation. The device also has an n-type cladding material overlying the n-type gallium and nitrogen containing material. The n-type cladding material is substantially free from an aluminum bearing material. The device further has an active region comprising at least three quantum wells. Each of the quantum wells has a thickness of 2.5 nm and greater or 3.5 nm and greater and one or more barrier layers according to a specific embodiment. Each of the barrier layers has a thickness ranging from about 2 nm to about 5 nm or about 3 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 3 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a {20-21}, {30-31}, {20-2-1}, or {30-3-1} crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a {20-21}, {30-31}, {20-2-1}, or {30-3-1} crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a {20-21}, {30-31}, {20-2-1}, or {30-3-1} crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least three quantum wells. In a specific embodiment, each of the quantum wells has a thickness of 2.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6V or less than about 7V for the device for an output power of 60 mW and greater. In other embodiments for nonpolar m-plane devices or semipolar (30-3-1), (30-31), (20-2-1), (20-21) planes, operable in the blue (430-475 nm) and green (505-530 nm), the present method and structure include five (5) or more thick QWs of greater than 4 or 5 nm in thickness and thin barriers that are 2-4 nm in thickness. An example of this structure can be found throughout the present specification and more particularly in reference to FIG. 1 as well as the description below.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 5 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, embodiments of the present invention provide laser devices and methods that are free from aluminum-containing cladding regions with low voltage on {20-21}, {30-31}, {20-2-1}, or {30-3-1} substrates. Of course, there can be other variations, modifications, and alternatives.

Moreover, embodiments of the present invention provide optical devices that are substantially free from aluminum bearing cladding materials. The device has a gallium and nitrogen containing substrate member having a {20-21}, {30-31}, {20-2-1}, or {30-3-1} crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first cleaved facet provided on the first end of the laser stripe region and a second cleaved facet provided on the second end of the laser stripe region. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like. Further details of these limitations can be found throughout the present specification and more particularly below.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further benefits are described throughout the present specification and more particularly below.

In a specific embodiment, the present invention provides an optical device. The optical device includes a gallium nitride substrate member having an m-plane nonpolar crystalline surface region characterized by an orientation of about −2 degrees to about 2 degrees towards (0001) and less than about +/−0.5 degrees towards (11-20) or preferably about −1 degree towards (0001) and less than about +/−0.3 degrees towards (11-20). In a specific embodiment, the crystalline surface can be characterized as a miscut and does not include a cut orientation of zero degrees. The device also has a laser stripe region formed overlying a portion of the m-plane nonpolar crystalline orientation surface region. In a preferred embodiment, the laser stripe region is characterized by a cavity orientation that is substantially parallel to the c-direction, the laser stripe region having a first end and a second end. The device includes a first cleaved c-face facet provided on the first end of the laser stripe region. In a specific embodiment, the first cleaved c-face facet is characterized by a laser scribed region. The device also has a second cleaved c-face facet provided on the second end of the laser stripe region. In a specific embodiment, the second cleaved c-face facet is characterized by a laser scribed region. In a preferred embodiment, the second cleaved c-face facet is exposed, is substantially free from an optical coating, or is exposed gallium and nitrogen containing material and the second cleaved c-face facet comprises a reflective coating. Of course, there can be other variations, modifications, and alternatives.

In a specific embodiment, the present invention provides an optical device. The optical device includes a gallium nitride substrate member having an m-plane nonpolar crystalline surface region characterized by an orientation of about −17 degrees to about 17 degrees towards a c-plane. In a specific embodiment, the crystalline surface can be characterized as a miscut and does not include a cut orientation of zero degrees. The device also has a laser stripe region formed overlying a portion of the m-plane nonpolar crystalline orientation surface region or alternatively the semipolar crystalline orientation surface region. In a preferred embodiment, the laser stripe region is characterized by a cavity orientation that is substantially parallel to the c-direction or the projection of the c-direction. In a preferred embodiment, the laser stripe region has a first end and a second end. The device includes a first cleaved face facet provided on the first end of the laser stripe region. In a specific embodiment, the first cleaved face facet is characterized by a laser scribed region. The device also has a second cleaved face facet provided on the second end of the laser stripe region. In a specific embodiment, the second cleaved face facet is characterized by a laser scribed region. In a preferred embodiment, the first cleaved facet comprises a reflective coating and the second cleaved facet comprises no coating, an antireflective coating, or exposes gallium and nitrogen containing material.

In an alternative specific embodiment, the present invention provides a method for forming an optical device. The method includes providing a gallium nitride substrate member having an m-plane nonpolar crystalline surface region characterized by an orientation of about −2 degrees to about 2 degrees towards (0001) and less than about 0.5 degrees towards (11-20) or preferably about −1 degree towards (0001) and less than about +/−0.3 degrees towards (11-20). In a specific embodiment, the crystalline surface can be characterized as a miscut and does not include a cut orientation of zero degrees. The device also has a laser stripe region formed overlying a portion of the m-plane nonpolar crystalline orientation surface region. In a specific embodiment, the laser stripe region is characterized by a cavity orientation substantially parallel to the c-direction. In a specific embodiment, the laser stripe region has a first end and a second end. The method preferably forms a pair of cleaved facets including a first cleaved c-face facet provided on the first end of the laser stripe region and a second cleaved c-face facet provided on the second end of the laser stripe region.

In other embodiments, the present invention includes a device and method configured on other gallium and nitrogen containing substrate orientations. In a specific embodiment, the gallium and nitrogen containing substrate is configured on a family of planes including the {20-21}, {30-31}, {20-2-1}, or {30-3-1} crystal orientations. In a specific embodiment, {20-21} is 14.9 degrees off of the m-plane towards the c-plane (0001). As an example, the miscut or off-cut angle is +/−17 degrees from the m-plane towards c-plane or alternatively at about the {20-21} crystal orientation plane. As another example, the present device includes a laser stripe oriented substantially in a projection of the c-direction, which is perpendicular to the a-direction (or alternatively on the m-plane, it is configured in the c-direction). In one or more embodiments, the cleaved facet would be the gallium and nitrogen containing face (e.g., GaN face) that is +/−5 degrees from a direction orthogonal to the projection of the c-direction (or alternatively, for the m-plane laser, it is the c-face). Of course, there can be other variations, modifications, and alternatives.

In a specific embodiment, the present invention provides a laser device comprising a gallium and nitrogen containing substrate having a surface region configured in a non-polar orientation, an active region comprising a plurality of quantum well regions and at least a pair of thin barrier regions configured on each of the sides of at least one of plurality of quantum well regions. That is, the quantum well region is sandwiched between the pair of barrier region in a specific embodiment.

In a specific embodiment, the present invention provides a laser device comprising a gallium and nitrogen containing substrate having a surface region configured in a non-polar orientation, an active region comprising at least five quantum well regions and at least four thin barrier regions configured to separate respective first quantum well region, second quantum well region, third quantum well region, fourth quantum well region, and fifth quantum well region. That is, a first barrier region separates the first from the second quantum well region, a second barrier region separates the second quantum well region from the third quantum well region, a third barrier region separates the third quantum well region from the fourth quantum well region, and the fourth barrier region separates the fourth quantum well region from the fifth quantum well region. In a preferred embodiment, each of the barrier regions is thin and is characterized by a thickness of 2.5 nm and less, which leads to reduced overall strain in the active region including both the quantum well regions and barrier regions. As used herein, the second, third, and fourth quantum well regions are configured within the first and fifth quantum well regions, which are configured within a vicinity of exterior portions of the active region. Of course, one of ordinary skill in the art would recognize that there may be more than five quantum well regions or fewer than five quantum well regions.

Additional benefits are achieved over pre-existing techniques according to various embodiments of the present invention. In particular, embodiments of the present invention enable a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar gallium nitride material capable of achieve a green laser device, among others. In one or more embodiments, the laser device is capable of emitting long wavelengths such as those ranging from about 500 nm to greater than about 540 nm, but can be others. In another embodiment the laser device is capable of operating in the blue region of 430 nm to 480 nm or the cyan region of 480 nm to about 500 nm. In yet another embodiment, the laser device is capable of operating in the violet region of 390 nm to 430 nm. In one or more preferred embodiments, the present invention provides a laser diode on a {20-21}, {30-31}, {20-2-1}, or {30-3-1} gallium and nitrogen containing material configured for emissions at about 522 nm and greater, but can be others. In a specific embodiment, the present method and structure use a top-side skip and scribe technique for improved cleaves in the laser device structure. In one or more embodiments, the present invention provides a method using a top side skip-scribe technique for good facets in the projection of the c-direction. In a preferred embodiment, the present device and method provide a laser device configured on a gallium and nitrogen containing substrate having thin barrier regions within the active region, and having a forward voltage of 7V and less, 6V and less, or 5V and less, which is desirable. Of course, there can be other variations, modifications, and alternatives. Depending upon the embodiment, one or more of these benefits may be achieved. These and other benefits may be described throughout the present specification and more particularly below.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane where h=k=0, and l is non-zero), non-polar GaN substrates (i.e., substrate material where the largest area surface is oriented at an angle ranging from about 80-100 degrees from the polar orientation described above towards an (h k l) plane where l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane where l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. As an example, the substrate can be configured on a semi-polar plane including (30-31), (30-3-1), (20-21), (20-2-1), (10-11), and (10-1-1), and others, which may be off-cut. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the A1 band. The length of the a-axis stripe determines which polarization comes out at the next mirror.

In certain embodiments, a monolithically integrated optical device comprises: a gallium and nitrogen containing substrate member having a surface region, the surface region being configured on either a non-polar surface orientation or a semi-polar surface orientation; a first waveguide structure configured in a first direction overlying a first portion of the surface region, the first waveguide structure configured in the first direction being characterized by a first gain and loss; and a second waveguide structure configured in a second direction overlying a second portion of the surface region, the second waveguide structure configured in the second direction being characterized by a second gain and loss, wherein the first direction is substantially perpendicular to the second direction.

In certain embodiments of an optical device, the surface orientation is the nonpolar m-plane; and wherein the second waveguide structure is integrally configured with the first waveguide structure to form a continuous waveguide structure or wherein the surface orientation is semi-polar and is a plane selected from a (20-21) plane, a (30-31) plane, a (20-2-1) plane, a (30-3-1) plane, and a (11-22) plane, or within +/−5 degrees toward a c-direction and/or toward an a-direction from the plane; and wherein the second waveguide structure is integrally configured with the first waveguide structure to form a continuous waveguide structure.

In certain embodiments of an optical device, the first direction is in a c-direction or a projection of a c-direction.

In certain embodiments of an optical device, the second direction is in an a-direction or m-direction.

In certain embodiments of an optical device, the first gain is greater than the second gain.

In certain embodiments of an optical device, the second gain is greater than the first gain.

In certain embodiments of an optical device, the first waveguide structure is configured to generate guided light with a first peak emission wavelength, the second waveguide structure is configured to generate guided light with a second peak emission wavelength, and the first peak emission wavelength is greater than the second peak emission wavelength.

In certain embodiments of an optical device, the first waveguide structure is configured to generate a first guided emission primarily in a first polarization state; and the second waveguide structure is configured to generate a second guided emission primarily in a second polarization state.

In certain embodiments of an optical device, the optical device further comprises a passive device operably coupled to the first waveguide structure and to the second waveguide structure.

In certain embodiments of an optical device, the surface orientation is the non-polar configuration, and the first waveguide structure is characterized by a maximum gain along a c-direction and laser light being polarized perpendicular to the c-direction.

In certain embodiments of an optical device, the surface orientation is in a semi-polar configuration and is a plane selected from a (20-21) plane, a (30-31) plane, a (20-2-1) plane, a (30-3-1) plane, and a (11-22) plane, or within +/−5 degrees toward a c-direction and/or toward an a-direction from the selected plane; wherein the first waveguide structure is characterized by a maximum gain along a projection of a c-direction and laser light being polarized perpendicular to the projection of the c-direction.

In certain embodiments of an optical device, the first waveguide structure is overlying a plurality of first strained quantum well regions; and the second waveguide structure is overlying a plurality of second strained quantum well regions; and the optical device further comprises a power supply operably coupled to at least one of the first waveguide structure or to the second waveguide structure to configure an optical length of a laser cavity associated with either the first waveguide structure or the second waveguide structure.

In certain embodiments of an optical device, the optical device further comprises total internal reflector mirrors configured to integrally couple the first waveguide structure and the second waveguide structure; and wherein reactive ion etching (RIE), inductively coupled plasma (ICP) etching, or chemically assisted electron beam etching (CAIBE) is used to form the total internal reflector mirrors.

In certain embodiments of an optical device, the first waveguide structure and the second waveguide structure form a laser structure form a laser cavity, and comprising lithographically defined mirrors at two ends of the laser cavity; and wherein the lithographically defined mirrors are etched facet mirrors and are formed with reactive ion etching (RIE), inductively coupled plasma (ICP) etching, or chemically assisted electron beam etching (CAIBE).

In certain embodiments of an optical device, the optical device further comprises a mirror surface coupled to each end of the first waveguide structure and to each end of the second waveguide structure.

In certain embodiments of an optical device, a lithographically defined mirror is defined in a first waveguide section and/or in a second waveguide section and/or in between a first waveguide section and a second waveguide section; and wherein the second waveguide section is electrically coupled to a power source and functions to modulate or absorb light propagating in the second waveguide section.

In certain embodiments of an optical device, the second waveguide structure is configured to increase or to decrease an optical length of a continuous waveguide structure comprising one or more first waveguide sections and one or more second waveguide sections by electrically coupling a power supply to the second waveguide section; and wherein the second waveguide section functions to tune the peak wavelength of the emitted light from the optical device.

In certain embodiments of an optical device, the first waveguide structure is operable in a passive mode; and wherein the second waveguide structure is operable in an active mode.

In certain embodiments of an optical device, the second waveguide structure is operable as a switching device, the switching device configured to allow emission of electromagnetic radiation derived from the first waveguide structure or to stop emission of the electromagnetic radiation derived from the first waveguide structure.

In certain embodiments of an optical device, the first waveguide structure is coupled to the second waveguide structure by at least one total internal reflecting turning mirror.

In certain embodiments of an optical device, the first waveguide structure is a first waveguide section and the second waveguide structure is a second waveguide section, the first waveguide structure and the second waveguide structure are included in a plurality of waveguide structures, numbered from 3 to N, wherein N is an integer greater than 3.

In certain embodiments of an optical device, the first waveguide structure comprises a plurality of first waveguide sections; and the second waveguide structure comprises a plurality of waveguide sections; and wherein the plurality of first waveguide structures are coupled to the plurality of second waveguide structures by a plurality of respective total internal reflecting turning mirrors.

In certain embodiments, monolithically integrated optical device comprise a gallium and nitrogen containing substrate member having a surface region, the surface region configured on either a non-polar orientation or a semi-polar orientation; a first waveguide structure configured in a first direction overlying a first portion of the surface region, the first waveguide structure configured in the first direction being characterized by a first gain and loss; a second waveguide structure configured in a second direction overlying a second portion of the surface region, the second waveguide structure configured in the second direction being characterized by a second gain and loss; and a mirror structure optically coupling the first waveguide structure with the second waveguide structure; wherein the first direction is substantially perpendicular to the second direction.

In certain embodiments of an optical device, the surface orientation is a nonpolar m-plane; and wherein the second waveguide structure is integrally configured with the first waveguide structure to form a continuous waveguide structure or wherein the surface orientation is semipolar and is a plane selected from a (20-21) plane, a (30-31) plane, a (20-2-1) plane, a (30-3-1) plane, and a (11-22) plane, or within +/−5 degrees toward a c-direction and/or toward an a-direction from thee planes; and wherein the second waveguide structure is integrally configured with the first waveguide structure to form a continuous waveguide structure.

In certain embodiments of an optical device, a lithographically defined mirror is defined in a first waveguide section and/or in a second waveguide section and/or in between a first waveguide section and a second waveguide section; and wherein the second waveguide section is electrically coupled to a power source and functions to modulate or absorb light propagating in the second waveguide section.

In certain embodiments, a monolithically integrated optical device comprises a gallium and nitrogen containing substrate member having a surface region, the surface region being configured on either a non-polar orientation or a semi-polar orientation; a first waveguide structure configured in a first direction overlying a first portion of the surface region, the first waveguide structure configured in the first direction being characterized by a first gain and loss; and a second waveguide structure configured in a second direction overlying a second portion of the surface region, the second waveguide structure configured in the second direction being characterized by a second gain and loss; and a reflector structure optically coupling the first waveguide structure and the second waveguide structure; wherein the first direction is substantially perpendicular to the second direction; and wherein the first waveguide structure comprises a plurality of first waveguide sections; the second waveguide structure comprises a plurality of second waveguide sections; and the plurality of first waveguide sections and the plurality of second waveguide sections are configured using the reflector structure to form a continuous waveguide cavity region.

In certain embodiments of an optical device, the reflector structure comprises a mirror device; a total internal reflector surface; and a turning mirror.

The foregoing description of the exemplary embodiments has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A system comprising:
   a laser diode;
   a power supply; and
   a package configured to enclose the laser diode and electrically couple the laser diode to the power supply, the laser diode comprising:
      a gallium and nitrogen containing substrate member having a surface region, the surface region having either a non-polar surface orientation or a semi-polar surface orientation;
      N waveguide structures each overlying a different portion of the surface region and each characterized by a gain and loss; and
      total internal reflector mirrors configured to integrally couple each of the N waveguide structures, wherein:
         each of the N waveguide structures is coupled to at least one immediately adjacent one of the N waveguide structures;
         each of the N waveguide structures extends in a different direction than immediately adjacent ones of the N waveguide structures; and
         N is at least two.

2. The system of claim 1, wherein:
   the surface region has an m-plane nonpolar surface orientation, and wherein the N waveguide structures are integrally configured to form a continuous waveguide structure, or
   the surface region has the semi-polar surface orientation and a plane selected from a (20-21) plane, a (30-31) plane, a (20-2-1) plane, a (30-3-1) plane, or a (11-22) plane, or within +/−5 degrees toward a c-direction and/or toward an a-direction from the plane, and wherein the N waveguide structures are integrally configured to form a continuous waveguide structure.

3. The system of claim 1, wherein a first waveguide of the N waveguide structures is configured to generate guided light with a first peak emission wavelength, and a second waveguide of the N waveguide structures is configured to generate guided light with a second peak emission wavelength, wherein the first peak emission wavelength is greater than the second peak emission wavelength.

4. The system of claim 1, wherein a first waveguide of the N waveguide structures is configured to generate a first guided emission primarily in a first polarization state, and a second waveguide of the N waveguide structures is configured to generate a second guided emission primarily in a second polarization state.

5. The system of claim 1, wherein the N waveguide structures form a laser cavity.

6. The system of claim 1, further comprising a mirror surface coupled to each end of the N waveguide structures.

7. The system of claim 1, wherein a mirror is defined in a first waveguide of the N waveguide structures and/or in a second waveguide of the N waveguide structures and/or in between the first waveguide and the second waveguide, and wherein the second waveguide is electrically coupled to a power source and is configured to modulate or absorb light propagating in the second waveguide.

8. The system of claim 1, wherein the package is configured for use in an application comprising at least one of a display application, a metrology application, a communications application, a health care or surgery application, or an information technology application.

9. The system of claim 1, wherein package is configured to provide at least one of cavity or wavelength tuning, mode hopping, active passive integration, facet passivation, photonic integrated circuits, or dual lasing action.

10. A system comprising:
    a laser diode;
    a power supply; and
    a package configured to enclose the laser diode and electrically couple the laser diode to the power supply, the laser diode comprising:
       a gallium and nitrogen containing substrate member having a surface region, the surface region having either a non-polar surface orientation or a semi-polar surface orientation;
       N waveguide structures each overlying a different portion of the surface region and each characterized by a gain and loss, wherein:
          each of the N waveguide structures is coupled to at least one immediately adjacent one of the N waveguide structures;
          each of the N waveguide structures extends in a different direction than immediately adjacent ones of the N waveguide structures;
          each of the N waveguide structures are coupled to another one of the N waveguide structures by at least one turning mirror; and
          N is at least two.

11. The system of claim 10, wherein:
    the surface region has an m-plane nonpolar surface orientation, and wherein the N waveguide structures are integrally configured to form a continuous waveguide structure, or
    the surface region has the semi-polar surface orientation and a plane selected from a (20-21) plane, a (30-31) plane, a (20-2-1) plane, a (30-3-1) plane, or a (11-22) plane, or within +/−5 degrees toward a c-direction and/or toward an a-direction from the plane, and wherein the N waveguide structures are integrally configured to form a continuous waveguide structure.

12. The system of claim 10, wherein a first waveguide of the N waveguide structures is configured to generate guided light with a first peak emission wavelength, and a second waveguide of the N waveguide structures is configured to generate guided light with a second peak emission wavelength, wherein the first peak emission wavelength is greater than the second peak emission wavelength.

13. The system of claim 10, wherein a first waveguide of the N waveguide structures is configured to generate a first guided emission primarily in a first polarization state, and a second waveguide of the N waveguide structures is configured to generate a second guided emission primarily in a second polarization state.

14. The system of claim 10, wherein the N waveguide structures form a laser cavity.

15. The system of claim 10, further comprising a mirror surface coupled to each end of the N waveguide structures.

16. The system of claim 10, wherein a mirror is defined in a first waveguide of the N waveguide structures and/or in a second waveguide of the N waveguide structures and/or in between the first waveguide and the second waveguide, and wherein the second waveguide is electrically coupled to a power source and is configured to modulate or absorb light propagating in the second waveguide.

17. The system of claim 10, wherein each of the N waveguide structures are coupled to another one of the N waveguide structures by at least one total internal reflecting turning mirror.

18. The system of claim 10, wherein package is configured to provide at least one of cavity or wavelength tuning, mode hopping, active passive integration, facet passivation, photonic integrated circuits, or dual lasing action.

19. The system of claim 10, wherein the package is configured for use in an application comprising at least one of a display application, a metrology application, a communications application, a health care or surgery application, or an information technology application.

* * * * *